United States Patent [19]

Ley et al.

[11] Patent Number: 4,494,068
[45] Date of Patent: Jan. 15, 1985

[54] MEASUREMENT SHUNT WITH COMPENSATION FOR INDUCED ERROR VOLTAGES

[75] Inventors: Antony Ley, Bievres; Roland Allesch, Antony; Alain Bazin, Villejuif, all of France

[73] Assignee: Enertec, Montrouge, France

[21] Appl. No.: 488,522

[22] Filed: Apr. 27, 1983

Related U.S. Application Data

[63] Continuation of Ser. No. 207,822, Nov. 17, 1980, abandoned.

[30] Foreign Application Priority Data

Nov. 28, 1979 [FR] France ................ 79 29222

[51] Int. Cl.³ ............................ G01R 1/20; H01C 5/00
[52] U.S. Cl. .................................... 324/126; 338/49
[58] Field of Search ............... 324/126, 76 R; 338/49, 338/61, 62, 63; 328/165; 333/12; 307/89, 91

[56] References Cited

U.S. PATENT DOCUMENTS

| | | | |
|---|---|---|---|
| 496,501 | 5/1893 | Weston | 324/126 |
| 1,084,721 | 1/1914 | Willis | 338/61 |
| 1,100,708 | 6/1914 | Brooks | 338/61 |
| 2,640,092 | 5/1953 | Fett et al. | 324/126 |
| 3,359,488 | 12/1967 | Park | 338/49 |

FOREIGN PATENT DOCUMENTS 1216981 5/1966 Fed. Rep. of Germany .
2348498 10/1977 France .

Primary Examiner—Ernest F. Karlsen
Attorney, Agent, or Firm—Dale Gaudier

[57] ABSTRACT

A measurement shunt comprises a resistance provided with first and second voltage terminals and intended to provide a voltage representative of an electric current passing through it, and an inductance connected to at least the first of said voltage terminals to produce between first and second measurement terminals a voltage free of error voltages induced in said resistance, even in the presence of a variable magnetic field. The resistance is essentially constituted by a plate (12) of electrically conductive material, the first and second voltage terminals (26,28) are disposed on the same edge of the plate at spaced apart points thereon, and the inductance comprises at least one open loop (36a) at least partly formed from an electrically conductive material extending from its first and second ends respectively disposed in the vicinity of the first and second voltage terminals, towards the interior of the surface of the plate in a plane having, at least approximately the same direction as the plate.

11 Claims, 5 Drawing Figures

U.S. Patent   Jan. 15, 1985   Sheet 1 of 2   4,494,068
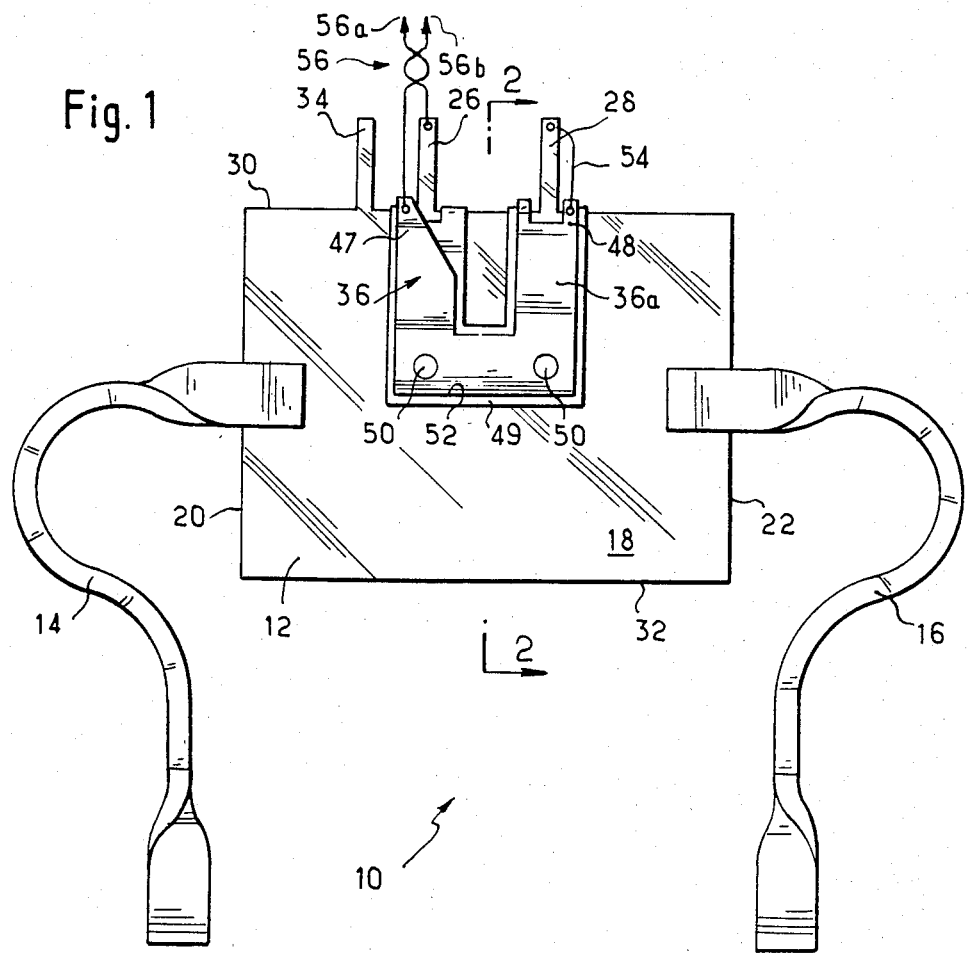
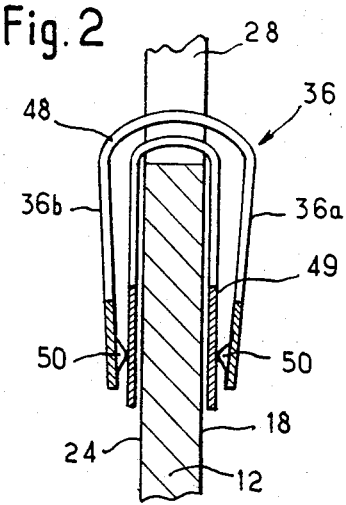
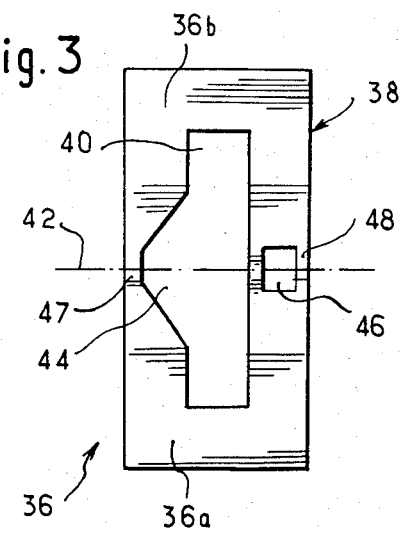

MEASUREMENT SHUNT WITH COMPENSATION FOR INDUCED ERROR VOLTAGES

This application is a continuation of application Ser. No. 207,822, filed 11/17/80, now abandoned.

The present invention relates to a measurement shunt, comprising a resistance provided with first and second voltage terminals and intended to provide a voltage representative of an electric current passing through it, and an inductance connected to at least the first of said voltage terminals to produce between first and second measurement terminals a voltage free of error voltages induced in said resistance, even in the presence of a variable magnetic field.

Existing shunts of this type, initially conceived not for protection against environmental magnetic fields but above all against the field produced by the current traversing the shunt itself, adopt a coaxial configuration, and by reason of the complexity of their construction and of their cost, are reserved for laboratory of other relatively sophisticated applications.

On the other hand the relatively recent industrial development of electricity meters such as watthour meters employing electronic techniques has resulted in the use of shunts devoid of compensation for induced error voltages, intended for supplying a voltage of about 5 mV for a current of 20 A, as well as shunts producing a voltage of about 7 mV for a current of 100 A. Such a watthour meter is described in application Ser. No. 905,450, filed May 12, 1978 now U.S. Pat. No. 4,359,684, and assigned to the assignee of the present application.

However, when such shunts, in their normal conditions of use, are subjected to alternating magnetic fields, which can be produced for example by adjacent power distribution circuits and/or by adjacent portions of the power distribution circuit in which the shunt is connected, the field can induce in the shunt a spurious voltage which is superimposed on the current representative voltage as an error. The Applicant has found that an alternating magnetic field of about 5 Oersteds, for example, perpendicular to the plane of such a shunt, can induce a spurious voltage of up to 50 $\mu$V, which represents an error whose magnitude is nearly 1% of the full-scale magnitude of the current representative voltage. Errors of this magnitude are unacceptable in watthour meters.

In this context, the object of the present invention is to provide a measurement shunt with compensation for induced error voltages, of simple structure and capable of being industrially mass-produced at relatively low cost, in particular for use in electronic watthour meters.

The measurement shunt of the present invention, comprising in known manner a resistance provided with first and second voltage terminals and intended to provide a voltage representative of an electric current passing through it, and an inductance connected to at least the first of said voltage terminals to produce between first and second measurement terminals a voltage free of error voltages induced in said resistance even in the presence of a variable magnetic field, is principally characterised in that the resistance is essentially constituted by a plate of electrically conductive material, the first and second voltage terminals are disposed on the same edge of the plate at spaced apart points thereon, and the inductance comprises at least one open loop at least partly formed from an electrically conductive material extending from its first and second ends respectively disposed in the vicinity of the first and second voltage terminals, towards the interior of the surface of the plate in a plane having, at least approximately, the same direction as the plate.

Preferably, the inductance is disposed in plane approximately parallel to the plate and adjacent thereto, and the resistance and the inductance are electrically isolated from each other other than at the first voltage terminal or at the first and second voltage terminals.

In one embodiment of the invention, the open loop forms an uninterrupted electrical path between its first and second ends, the first end of the loop is electrically connected to the first voltage terminal, and the first and second measurement terminals are respectively connected to or constituted by the second voltage terminal and the second end of the loop.

Advantageously, in this first embodiment, the inductance comprises two aligned U-shaped loops disposed on opposite faces of the plate, these two loops being physically connected by their respective first and second ends to form a one-piece rider. For example, the rider may be made from an electrically conductive spring material, such as a bronze-beryllium alloy, and may thus clip onto the plate.

In a second embodiment of the invention, still better adapted for industrial production, the open loop is formed by two converging portions of two different electrical conductors which are insulated from each other, the first portion having one end electrically connected to the first voltage terminal, the second portion having one end electrically connected to the second voltage terminal, and the portions converging towards each other in the direction away from the ends connected to the voltage terminals. Preferably, said portions are disposed on the same side of the plate and meet at a common point near the edge of the plate opposite the edge on which the first and second voltage terminals are disposed, the conductors extend from this common point as a twisted pair, and said measurement terminals are constituted by respective ends of the twisted pair. Advantageously the open loop is bonded to one face of the plate by an adhesive.

In either embodiment, the plate is conveniently substantially rectangular and may be formed, for example, from manganin.

The invention will now be described, by way of nonlimitative example only, with reference to the accompanying drawings, of which:

FIG. 1 is a plan view of one embodiment of a shunt in accordance with the present invention;

FIG. 2 is an enlarged section on the line 2—2 of FIG. 1;

FIG. 3 is a plan view of a blank or stamping for making an inductor forming part of the shunt of FIG. 1;

Figure 4:
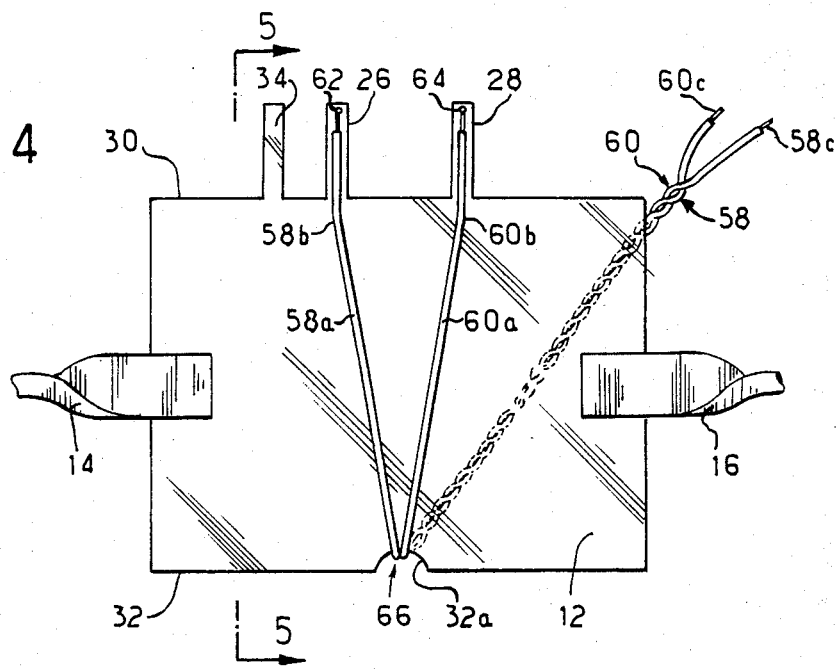
FIG. 4 is a plan view of a second embodiment of a shunt in accordance with the present invention.

The shunt illustrated in FIGS. 1, 2, 4 and 5 is indicated generally at 10, and comprises a resistance formed by a rectangular plate 12, typically about 4 cm long by 3 cm wide by 2 mm thick, made from manganin alloy supplied under the trade name "Manganin 42". The shunt 10 has an input lead 14 and an output lead 16, which are brazed to one face 18 of the plate 12 adjacent the centre of respective ones of the two shorter sides 20, 22 thereof. The leads 14, 16 are made from suitably cut, bent and twisted lengths of relatively thick copper bar (typically 7 mm by 3 mm in section), and are brazed to the plate 12 using a silver/phosphor (AgP) brazing amalgam and an electrical resistance heating technique: in this technique, a relatively high current is passed for a few seconds between a first carbon electrode pressing the respective ends of the leads 14, 16 against a thin layer of the amalgam on face 18 of the plate 12 and a second carbon electrode pressed against the other face 24 of the plate 12.

The plate 12 has first and second measurement terminals 26, 28 respectively projecting in the plane of the plate, from one of its two longer sides 30, 32. As can be seen in FIG. 1, the terminals 26, 28 project from the side 30, and are substantially symmetrically disposed on each side of the centre of the side 30. A third terminal 34, which serves as a power supply terminal as will hereinafter be explained, projects from the side 30 of the plate 12 adjacent the terminal 26.

In use, the shunt 10 typically forms part of an electronic watthour meter of the kind described in U.S. Pat. No. 4,359,684, and is accordingly connected in series with the (or a) live wire of the electrical power distribution circuit in which the meter is connected. The current flowing in this live wire, typically having a maximum value of 100 amps, flows into and out of the plate 12 via the leads 14 and 16 respectively, producing a voltage proportional to the current between the first and second measurement terminals 26, 28. This voltage is typically 7 mV for a current of 100 amps, and can be adjusted prior to use by a calibration operation in which a small amount of the material of the plate 12 is progressively drilled away, between the terminals 26, 28 near the side 30, while a precisely determined current, eg 100 amps, is flowing through the shunt, until the voltage between the terminals 26, 28 reaches the desired value.

The current representative voltage produced between the terminals 26, 28 is applied to the electronic circuitry of the meter and processed by this circuitry as described in the aforementioned patent application. The return (or zero volt) power supply rail of the circuitry is connected to the power supply terminal 34 of the shunt 10, ensuring that the current used by the circuitry does not flow through either of the terminals 26, 28 and therefore does not affect the input voltage to the circuitry for processing.

However, as indicated earlier, if the shunt 10 is subjected to an alternating magnetic field having a component perpendicular to the plane of the plate 12, a spurious voltage is induced in the plate 12, between the terminals 26, 28, and this spurious voltage can be as high as 50 $\mu$V for a field of 5 Oersteds. To compensate for this spurious voltage, the shunt of the invention comprises a compensating inductance essentially constituted by one or several open loops such as 36a or 36b in FIGS. 1 to 3, or such as that which is formed by the combination of 58 and 60 in FIG. 4, each loop being at least partially made from an electrically conductive material.

Each open loop comprises a first extremity or end, such as 47 in FIG. 1 or 58b in FIG. 4, which is disposed in the vicinity of the voltage terminal 26, and a second extremity or end, such as 48 in FIG. 1 or 60b in FIG. 4, which is disposed in the vicinity of the voltage terminal 28.

Between its two ends, the loop extends at least approximately in a plane extending in the same direction as the surface of the plate, as close as possible to this surface and towards the inner part or centre of this surface with respect to the edge 30, that is to say approaching the edge 32 opposite the edge 30. The dimensions and the form of the or each open loop are chosen to produce an inductance equal to that of the plate 12 between the terminals 26 and 28, when the plate is subjected to a magnetic field. The choice of the dimensions and form can easily be arrived at, once and for all by trial and error, by placing the plate 12 and its compensation loop or loops in an alternating magnetic field, continuously measuring the inductance of the plate and that of the loop, and modifying the form and/or the dimensions of the loop to obtain equality of those inductances.

In the first embodiment of the invention (FIGS. 1 to 3), two open loops 36a and 36b are provided, constituted by a compensating member 36 substantially in the form of a rider which clips over the side 30 of the plate 12 in the region of the terminals 26, 28, 34. The member 36 is made by stamping and folding, as follows. An initial stamping or blank 38, of the generally rectangular form illustrated in FIG. 3, is stamped from a sheet of a springy electrically conductive material, such as beryllium bronze. The stamping 38 has a generally rectangular opening 40 which is symmetrically disposed about a line 42 extending between the respective centres of its two longer sides. One edge of this opening 40 has a cutaway portion 44, also symmetrically disposed about the line 42, while a much smaller opening 46, again symmetrically disposed about the line 42, is provided in the stamping 38, on the opposite side of the opening 40 to the cutaway portion 44. The stamping 38 is folded in half along the line 42 to form the member 36 into its aforementioned form of a rider. The member 36 thus consists of two aligned U-shaped portions 36a and 36b which are integrally joined together at the tops 47, 48 of the corresponding limbs of their respective U-shapes to form a spring clip which can be clipped over the sides 30 of the plate 12.

The cutaway portion 44 and the opening 46 provide clearance for the terminals 26 and 28 respectively. Additionally, a layer 49 of insulating material, typically paper, is disposed between the member 36 and the plate 12 to insulate them from each other. In order to prevent the possibly sharp edges of the member 36 from cutting into the layer 49 of insulating material several smooth convex projections 50 are formed in the surfaces of the member 36 which bear on the layer 49, by stamping dimples in the surface of the stamping or blank 38 which is going to form the external surface of the member 36 after folding.

To fit the member 36 on the plate 12, the appropriate part of the plate 12 is coated with a suitable bonding agent, e.g. epoxy resin, then the layer 49 of insulating material is stuck on. After applying a further coating of the bonding agent the member 36 is clipped on, over the layer 49, the precise position of the lower edge 52 of the member 36 with respect to the side 32 of the plate 12 being determined by a fixture or jig (not shown) which is clipped to and located by the side 32. Finally, another coating of the bonding agent is applied over the member 36.

By its form, the member 36 effectively constitutes two open loops (formed by two half-turns) of an inductor, these loops being connected in parallel. The dimensions of the member 36 are chosen to provide an effective inductance value between the tops 47, 48 of the limbs of its U-shaped equivalent to that of the plate 12: typical values of the dimensions of the U-shape of the member 36 are 1.5 cms high by 1.5 cms wide, with a 0.5 cm between the limbs. Since by virtue of its position, the member 36 is subjected to substantially the same magnetic field as the plate 12, a voltage substantially equal to the spurious voltage induced between the terminals 26, 28 of the plate 12 is induced between the respective tops 47, 48 of the limbs of the U-shaped of the member 36. By electrically connecting the terminal 28 to the top 48 of the adjacent limb of the member 36 via a wire connection 54, and taking the output voltage of the shunt 10 between the free ends 56a, 56b constituting measurement terminals, of a twisted pair of conductors 56 connected one to the terminal 26 and the other to the top 47 of the other limb of the member 36, the voltage induced in the member 36 substantially cancels, or backs off, the spurious voltage induced between the voltage terminals 26, 28. The Applicant has found that the 50 μV spurious voltage mentioned earlier can be reduced by a factor of more than ten by the member 36. In this embodiment, the free end 56a and the top 47 of the member 36 can both be considered as one of the measurement terminals, the other being constituted by the end 56b or the voltage terminal 26.

Figure 5:
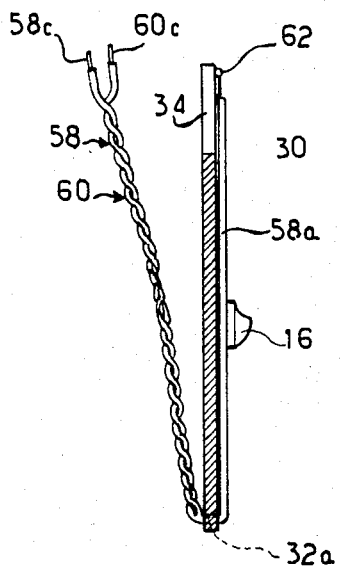
FIG. 5 is a section on the line 5—5 of FIG. 4.

In the second embodiment of the invention, which is shown in FIGS. 4 and 5 and which is simpler to implement, there is provided a single open loop, constituted by two converging portions 58a, 60a of two different electrical conductors 58, 60 which are insulated from each other. One end 58b of the conductor portion 58a is soldered to the voltage terminal 26 of the shunt at 62, one end 60b of the conductor portion 60a is soldered to the voltage terminal 28 at 64, and the conductor portions 58a and 60a convergent on each other in the direction away from their ends 58b, 60b towards a common point 66, which is disposed near the edge 32 of the plate 12. To permit good location of the conductor portions 58a and 60a, a notch 32a is formed in the edge 32, this notch serving to hold in place the meeting point 66 of the conductor portions.

It will be noted that in this second embodiment, unlike the first embodiment, the open loop 58a, 60a, while essentially made from electrically conductive material, does not form an uninterupted electrical path between its ends 58b and 60b. In effect, since the conductors 58, 60 are insulated from each other, the portions 58a and 60a are not only both insulated from the plate 12, but also insulated from each other, including at their meeting point 66 in the notch 32a.

Beyond the meeting point 66 of the portions 58a and 60a, the insulated conductors 58 and 60 are twisted together, and the voltage representative of the current to be measured between the terminals 26 and 28 is taken between the free ends 58c and 60c of the conductors 58 and 60 which thus constitute the measurement terminals of the shunt.

In this second embodiment, the open loop fairly typically adopts the shape of a V, and thus has a shape fairly close to that of the loops 36a and 36b of the first embodiment.

However, it is possible to find by trial and error substantial variations of this V-shape, without departing from the desired result.

The shape and dimension of the loop having been finally determined, it is convenient to maintain the loop in place on one face of the plate 12 by means of an adhesive.

Many modifications can be made to the described embodiment without departing from the scope of the invention.

In particular, in modifications of the first embodiment the member 36 can be constituted by a single half turn or other open loop formed by a wire suitably bonded to, but insulated from, one face of the plate 12, or even by a further plate substantially identical to the plate 12, again bonded to but insulated from one face of the plate 12. In this latter case, the further plate has first and second terminals respectively corresponding to the terminals 26, 28 of the plate 12, and the second terminal is connected to the terminal 28 : the first terminal and the terminal 26 can then be regarded as the measurement terminals of the shunt (or can be connected by a twisted pair of conductors such as is shown at 56 in FIG. 1 to measurement terminals such as 56a, 56b).

In another embodiment, the compensating inductance is formed in the plate 12 itself. To this end, the plate 12 is folded on itself about the line 2—2 of FIG. 1, the faces of the two halves of the folded plate being electrically insulated from each other and the terminals 26, 28 being regarded as the measureaent terminals or being connectcd by a twisted pair of conductors such as is shown at 36 in FIG. 1 to measurement such as 56a, 56b.

In this last embodiment, as well as in that using a further plate similar to the plate 12, no adjustment of the shape or dimensions of the loop is necessary. It should be noted however, that the last embodiment described, although apparently the most simple, can be made only with relatively thin plates 12, and requires heat treatment of the plate after bonding to restore its initial crystalline structure.

We claim:
1. A measurement shunt comprising:
  a resistance formed from a plate of electrically conductive material, first and second current terminals and voltage terminal means connected to the plate, the voltage terminal means being disposed on a common edge of the plate at spaced apart points thereon, the resistance proving at the voltage terminal means a voltage representative of an electric current applied to the shunt at said current terminals and passing through the resistance; and
  inductor means for developing a stray variable magnetic field induced voltage that is equal in magnitude and opposite in polarity to any stray variable magnetic field induced error voltage in said plate, the inductor means being formed from an electrically conductive material and having first and second ends disposed in the vicinity of the voltage terminal means, the inductor means extending from its first and second ends towards the interior of the surface of the plate in a plane substantially parallel to and adjacent the plate, electrical insulation means between said inductor means and said plate, the inductor means being connected electrically in series with a path in the plate via the voltage terminal means and between first and second measurement terminals, the inductor means providing, in the presence of a variable magnetic field, a voltage free of induced error voltage at the measurement terminals.

2. A shunt according to claim 1, wherein the voltage terminal means includes first and second voltage terminals and said inductance means comprises an open loop which forms an uninterrupted electrical path between its first and second ends, the first end of the loop is electrically connected to the first voltage terminal, and the first and second measurement terminals are respectively connected to the second voltage terminal and the second end of the loop.

3. A shunt according to claim 2, wherein the inductor means comprises two aligned U-shaped loops disposed on opposite faces of the plate, these two loops being physically connected by their respective first and second ends to form a one-piece rider.

4. A shunt according to claim 3, wherein the rider is made from an electrically conductive spring material and clips onto the plate.

5. A shunt according to claim 4, wherein said spring material is a bronze-beryllium alloy.

6. A shunt according to claim 1, wherein said voltage terminal means includes first and second voltage terminals, and wherein the inductor means is formed by two converging portions of two different electrical conductors which are insulated from each other, the first portion having one end electrically connected to the first voltage terminal, the second portion having one end electrically connected to the second voltage terminal, and the portions converging towards each other extend in a direction away from the ends connected to the voltage terminals.

7. A shunt according to claim 6, wherein said portions are disposed on the same side of the plate and meet at a common point near the edge of the plate opposite the edge on which the first and second voltage terminals are disposed, the conductors extend from this common point as a twisted pair, and said measurement terminals are constituted by respective ends of the twisted pair.

8. A shunt according to claim 1, wherein the plate is substantially rectangular.

9. A shunt according to claim 1, wherein said inductor means is bonded to one face of the plate by an adhesive.

10. A shunt according to claim 3 wherein the plate is substantially rectangular.

11. A measurement shunt comprising:

a resistance formed from a plate of electrically conductive material, first and second current terminals, and first and second voltage terminals disposed on a common edge of the plate at spaced apart points thereon, the resistance providing between the first and second voltage terminals a voltage representative of an electric current applied to the shunt at the current terminals and passing through the resistance; and inductor means for developing a stray variable magnetic field induced voltage that is equal in magnitude and opposite in polarity to any stray variable magnetic field induced error voltage in said plate, the inductor means comprising at least one open loop formed of an electrically conductive material and having first and second ends disposed respectively in the vicinity of the first and second voltage terminals, the loop extending from its first and second ends toward the interior of the surface of the plate in a plane substantially parallel to and adjacent the plate, electrical insulation means between said inductor means and said plate, the inductor means being connected electrically in series with a path in the plate via said voltage terminals and between first and second measurement terminals, the inductor means providing, in the presence of a variable magnetic field, an induced voltage compensating for the voltage induced in the resistance by such magnetic field, such that a voltage free of induced error voltrage appears between the measurement terminals.

* * * * *